US006249172B1

United States Patent
Ghilardelli et al.

(10) Patent No.: US 6,249,172 B1
(45) Date of Patent: Jun. 19, 2001

(54) CIRCUIT FOR DISCHARGING A NEGATIVE POTENTIAL NODE TO GROUND, INCLUDING CONTROL OF THE DISCHARGE CURRENT

(75) Inventors: Andrea Ghilardelli, Cinisello Balsamo; Stefano Commodaro, Bogliasco; Maurizio Branchetti, San Polo d'Enza; Jacopo Mulatti, Latisana, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/275,200

(22) Filed: Mar. 24, 1999

(30) Foreign Application Priority Data

Mar. 27, 1998 (IT) .............................. MI98A0639

(51) Int. Cl.[7] .................................................. H03K 17/16
(52) U.S. Cl. .......................... 327/391; 327/534; 327/543; 327/408; 365/185.25; 365/226
(58) Field of Search .................................. 327/389, 391, 327/434, 408, 435, 534, 543; 365/185.2, 185.25, 226

(56) References Cited

U.S. PATENT DOCUMENTS

| 5,572,152 | * | 11/1996 | Ueda ...................................... 326/126 |
| 5,610,533 | * | 3/1997 | Arimoto et al. ........................ 326/33 |
| 5,615,146 | * | 3/1997 | Gotou ............................... 365/185.01 |
| 5,617,057 | * | 4/1997 | Rees et al. ............................ 327/543 |
| 5,650,959 | * | 7/1997 | Hayashi et al. ....................... 365/182 |
| 5,736,866 | * | 4/1998 | Harr ....................................... 326/18 |
| 5,767,702 | * | 7/1998 | Hense et al. .......................... 326/126 |
| 5,781,035 | * | 7/1998 | Tashibu ................................. 326/126 |
| 5,886,937 | * | 3/1999 | Jang ...................................... 365/203 |

* cited by examiner

Primary Examiner—Terry D. Cunningham
(74) Attorney, Agent, or Firm—Wolf, Greenfield & Sacks, P.C.; James H. Morris; Theodore E. Galanthay

(57) ABSTRACT

Circuit for discharging to ground, supplied by a supply voltage, comprising a reference voltage, a negative potential node, first circuitry adapted to couple the negative potential node to the reference voltage in response to a control signal. Second circuitry is provided adapted to determine in the first circuitry the passage of a controlled current for the discharge of the negative potential node.

12 Claims, 4 Drawing Sheets

CIRCUIT FOR DISCHARGING A NEGATIVE POTENTIAL NODE TO GROUND, INCLUDING CONTROL OF THE DISCHARGE CURRENT

BACKGROUND OF THE INVENTION

1. Field of the Invention

The present invention relates to a circuit for discharging to ground, with control of the discharge current, a node having a negative potential, to which a large capacitance is connected, particularly for use in a non volatile memory, such as a Flash EEPROM or EEPROM memory, in operations in which the initial conditions of the voltage values of the nodes are to be restored.

2. Discussion of the Related Art

Many conventional non volatile memory devices, especially those having a single voltage supply, need to internally generate voltage values out of the range between ground and the supply voltage. There exist therefore negative voltage levels and voltage levels higher than the supply voltage, which are essential for performing the operations of writing and erasing of the memory cells. The nodes of the circuit with negative voltage values, once said operations are terminated, must be restored to their initial voltage values.

For instance, making reference to FIG. 1, a Flash EEPROM memory is schematically represented. FIG. 1 could as well represent a sector of a Flash EEPROM memory, in the case this includes more sectors selectively addressable. The memory comprises memory cells 1, constituted by floating-gate N-channel MOS transistors, conventionally arranged in rows WLO–WLn ("word lines") and columns BLO–BLm ("bit lines") to form a matrix. The rows of the matrix are accessible through a row decoder $ROW_{13}DEC$ that receives and decodes row address signals RADD. Such decoder includes a plurality of final driving stages of the rows, each one substantially constituted by a CMOS inverter 2 supplied by a voltage VPCX and a voltage node RDS, to which a capacitance 3 is connected. Node RDS can be selectively connected to the ground of the integrated circuit in the case of reading and programming, as well as during erasing, if the particular sector must not be erased. To erase the sector, node RDS is instead connected to a line carrying a negative voltage value ($V_N$), generated by a charge pump 4. In this last case, the inputs of all the final inverters 2 are brought to the voltage VPCX.

The management of the negative voltage values in a circuit built in CMOS technology can pose some difficulties, in that it may not be possible to apply negative voltages of desired value to the source or drain electrodes of the N-channel MOSFETs, without forward biasing the source/substrate or drain/substrate junctions, since the substrate connects the integrated circuit to ground.

Such a problem is solved using CMOS technology that allows isolation of the bulk electrode of the N-chanTel MOSFET transistors from the substrate of the device which is necessarily connected to ground.

In FIG. 2, for instance, the section of an N-channel MOS transistor is shown, realized in a triple well technology, and in FIG. 3 the circuit symbol that represents such transistor is shown. In FIG. 2 a deep P type substrate 6 is connected to ground. An N type tub 7 formed inside the substrate 6 is connected to the supply voltage VDD; inside tub 7, another P type tub 8 is formed with two N+ doped zones corresponding to the drain and source electrodes; the electrode of the tub 8 is connected to the source electrode. The substrate 6 and the tubs 7 and 8 are connected to the respective external electrodes thereof through contact regions that have a higher doping.

With this triple well technology the N-channel MOSFET has the N type tub 7 such that by applying the positive supply voltage VDD to this tub it is possible to reverse bias all the parasitic junctions existing inside the structure, even when negative voltages are applied to the source electrode, which is connected to the bulk electrode 8 of the transistor.

The way to discharge a node from a voltage value to another value having a small absolute value, provides for connecting the node to a node with constant potential value equal to the final value, through a transresistance. For instance, with reference to FIG. 1, switch means 5 are present that are closed between node RDS and the ground of the memory.

Such solution has the drawback that results in a transient whose duration depends, through an exponential relationship, on a time constant directly proportional to the value of the resistance R and of the capacitance C associated with the node that is to be discharged ($\mu=R*C$). When the capacitance associated with the node has a high value, the transient lasts for too long a time. Therefore, to speed up the process it is necessary to decrease the value of the discharge resistance, in such way to have a time constant of acceptable values.

However, by decreasing the value of the discharge resistance, the value of the current that flows through such resistance is increased and this creates undesired effects in the circuit:

- a first effect is due to the fact that a high value current, injected in a node connected to a real (i.e., not ideal) voltage generator, whose internal impedance is therefore different from zero, can cause an undesired variation of the potential of this node; in the case such current is injected in reference nodes such as the ground and the supply voltage, malfunctions of the whole circuit can be caused;
- a second undesired effect of the high values of current is the high dissipation of power for Joule effect, that can raise the operating temperature of the circuit component and reduce the reliability thereof;
- a further complication derives from the fact that the cross-section of the conductors that form the electric connections inside the circuit have to be sized according to the maximum value of current density that can transit therethrough, to avoid phenomenons of electromigration, and a high value of the current requires therefore a large conductor cross-section, with a consequent increase of area and of parasitic capacitances.

In view of the state of the art described, it is an object of the present invention to provide a circuit capable of discharging to ground a node whose potential has negative values and to which a high capacitance is possibly associated, without incurring in the aforementioned problems.

SUMMARY OF THE INVENTION

According to the present invention, this and other objects are achieved through a circuit for discharging to ground and fed by a supply voltage, comprising a reference voltage, a node with negative potential, first circuit means for coupling the node with negative potential to the reference voltage in response to a control signal, and comprising second circuit means for determining, in the first circuit means, the passage of a controlled current for the discharge of the negative potential node.

BRIEF DESCRIPTION OF THE DRAWINGS

The features and advantages of the present invention will result evident from the following detailed description of one embodiment thereof, illustrated by way of a non limiting example in the annexed drawings, wherein.

DETAILED DESCRIPTION

Figure 4:
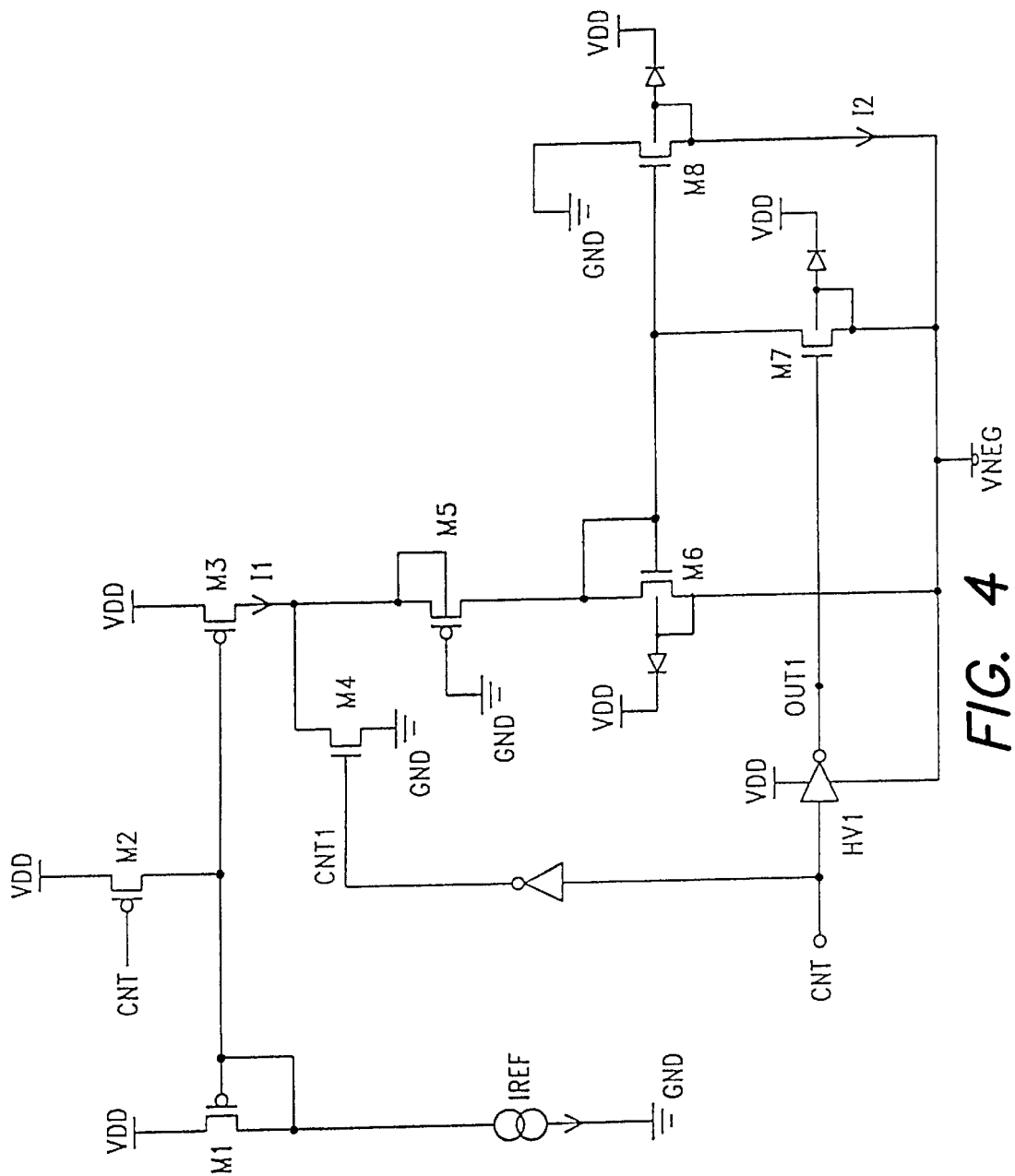
FIG. 4 is a circuit diagram of a circuit of discharge according an embodiment of the present invention.

FIG. 4 is a schematic diagram of a circuit for discharging to ground according to an embodiment of the present invention; such circuit is supplied by a voltage VDD, and by a reference voltage (ground=GND) that also acts as a first input of the circuit. The circuit further receives a second input constituted by a voltage of negative value VNEG.

A control signal CNT is supplied to the circuit. Control signal CNT can take two logical levels, low (ground=GND) or high (VDD).

Figure 5:
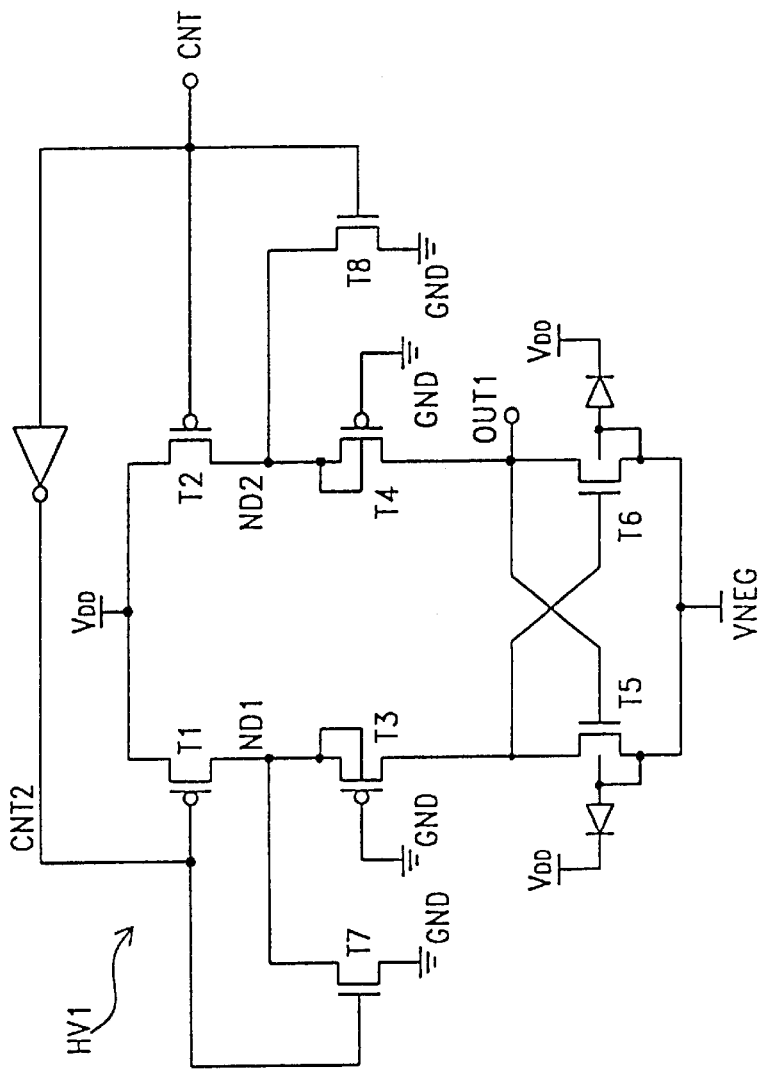
FIG. 5 is a circuit diagram of an inverting level translator circuit, usable in an embodiment of the present invention.

The circuit includes an inverting level translator circuit HV1, one embodiment of which being shown in FIG. 5, driven by the control signal CNT and whose output OUT1 drives an N-channel MOSFET transistor M7. Transistor M7 has the source electrode connected to the negative voltage VNEG and the drain electrode that drives an N-channel MOSFET M8. Transistor M8 has in turn its source electrode connected to the negative voltage VNEG and its drain electrode connected to ground. The circuit includes two P-channel MOSFET M1 and M3, supplied by the voltage VDD and connected to form a first current mirror, polarized by the current furnished by a reference current generator IREF. The gate electrode in common between the two MOSFETs M1 and M3 is connected to a third P-channel MOSFET M2, supplied by the voltage VDD and driven by the control signal CNT.

The output of the current mirror constituted by MOSFETs M1 and M3, is connected to two MOSFETs M4 and M5, respectively N-channel and P-channel: transistor M4 is driven by the complement CNT1 of the control signal, has the source electrode connected to ground and the drain electrode connected to transistor M3, while transistor M5 has the gate electrode connected to ground, the drain electrode connected to a second current mirror formed by an N-channel MOSFET M6 and by MOSFET M8 and the source electrode connected to transistor M3. MOSFET M6 has the source electrode connected to node VNEG and the drain electrode connected to transistor M5.

The inverting level translator HV1 can take at the output thereof the values of voltage equal to VDD or VNEG depending on the fact that at the input thereof a signal of voltage equal to 0V or VDD is present, respectively.

Figure 1:
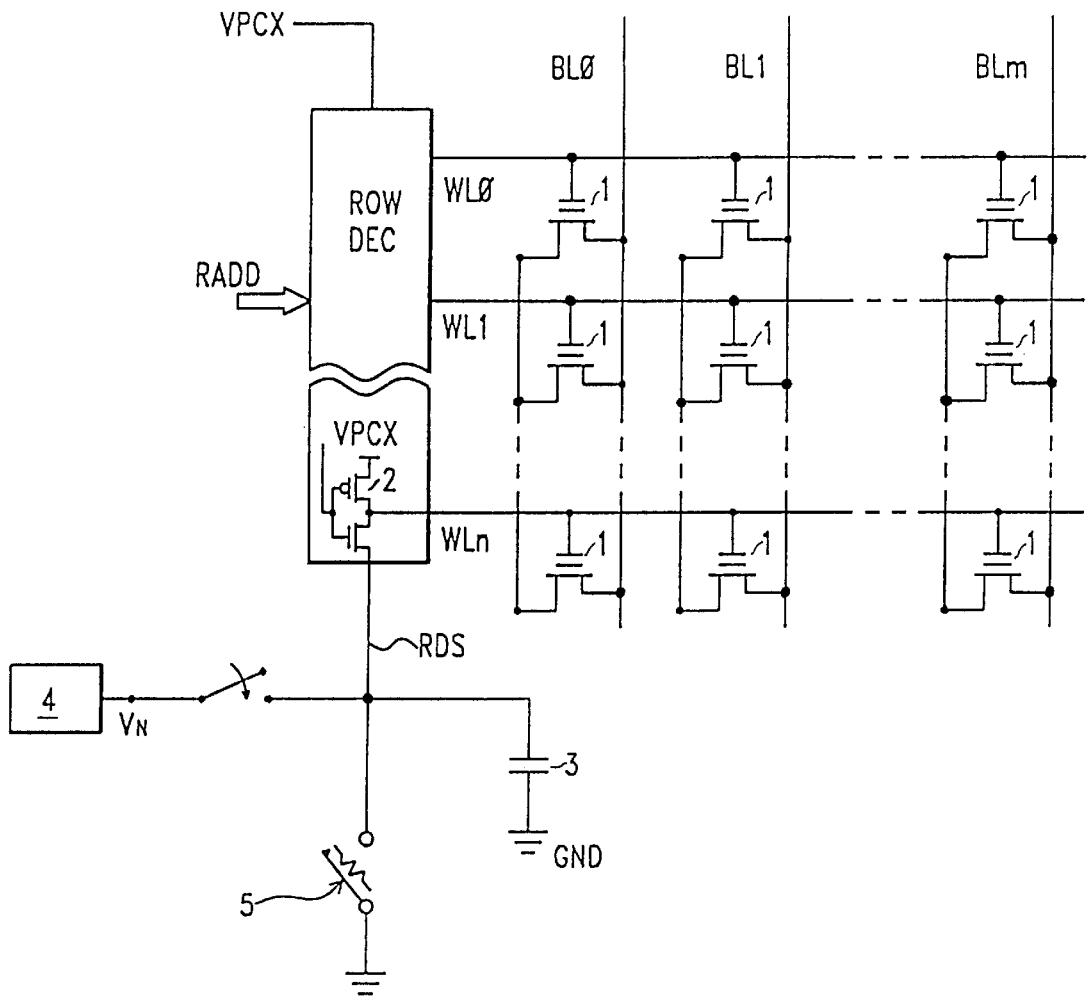
FIG. 1 schematically shows a conventional Flash EEPROM memory.
Figure 2:
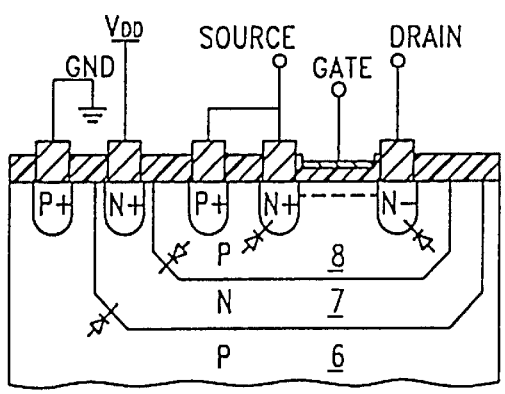
FIG. 2 and FIG. 3 respectively represent the cross-section and the circuit symbol of an N-channel MOS transistor realized in triple well technology, usable in an embodiment of the present invention.
Figure 3:
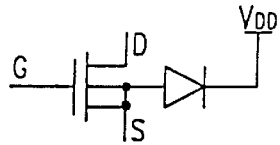

The N-channel MOSFETs M6, M7 and M8, connected to the node with negative potential VNEG, are realized in a triple well technology, i.e., they have an internal structure equal to that shown in FIG. 1.

The bulk electrode of the P-channel MOSFET M5 is connected to the source electrode thereof, to avoid an excessive difference of potential across the substrate/drain junction.

FIG. 5 shows a circuit diagram of an inverting level translator circuit, usable in an embodiment of the present invention, corresponding to the circuit block HV1 of FIG. 4.

Such circuit receives the control signal CNT, it outputs the signal OUT1 and it is connected among the supply voltage VDD and the negative voltage VNEG.

The circuit has a symmetrical structure and comprises a pair of P-channel MOSFETs T2 and T1, with the source electrode connected to the supply voltage VDD and respectively driven by the control signal CNT and by a logical complement CNT2 thereof. Signals CNT and CNT2 also drive respectively two N-channel MOSFETs T8 and T7, that have the respective source electrodes connected to ground and the drain electrodes connected to the drain electrodes of the two MOSFETs T2 and T1, indicated in the drawing with the nodes ND2 and ND1.

To nodes ND2 and ND1 there are also respectively connected the source electrodes of two P-channel MOSFETs T4 and T3, that have the gate electrodes connected to ground. The drain electrode of transistor T4 corresponds to the output node OUT1.

The circuit further includes two N-channel MOSFETs T6 and T5 realized in triple well technology, fed to the source thereof by the voltage VNEG. The gate electrode of transistor T5 is connected, together with the drain electrode of transistor T6, to the output node OUT1 and symmetrically the gate electrode of transistor T6 is connected to the drain electrode of transistor T5. Transistors T5 and T6 form therefore a "latch" structure.

The operation of such inverting level translator circuit HV1 will be now analyzed in detail.

In the case in which the control signal CNT is at the high logical level (of value equal to VDD), transistor T2 is off while transistor T8 is turned on and, as a result, node ND2 has a voltage value equal to the reference voltage (ground). Transistor T4 is off and uncouples node ND2 from the output node OUT1.

Transistor T1, being driven by the complement CNT2 of the control signal, is turned on while transistor T7 is off and accordingly node NDI has a voltage of value equal to VDD. Such value turns on transistor T3 and therefore the node corresponding to the drain electrode of transistor T3 has a voltage value equal to VDD. Such node, driving transistor T6, turns this last on and therefore the output node OUT1 takes a value of voltage equal to VNEG. Transistor T5 is off.

If now it is desired to set the output node OUT1 at a voltage value equal to VDD, it is sufficient that the control signal CNT is set to the low logical level: as a result of the symmetry of the structure, all the transistors that before were turned on will now be off and vice versa, those that were off will be turned on, allowing the output node to take the desired value of voltage equal to VDD.

The operation of the circuit of FIG. 4 will be now analyzed in detail.

In the case in which the control signal CNT is at the high logical level, the inverting level translator HV1, provides, at the output node OUT1 a negative voltage value VNEG that turns transistor M7 off. The control signal CNT and complement CNT1 also turn transistors M2 and M4 off, respectively, and therefore at the output of the current mirror formed by the two transistors M1 and M3 which are turned on, a current I1 circulates. Current I1 has a constant value dependent on the value of the current supplied by the current generator IREF and on the dimensions of transistors M1 and M3.

Transistor M5 is turned on and it allows the current I1 in output of the first current mirror to flow in the second current mirror by transistors M6 and M8, which are turned on: in this way at the output of the second current mirror, that is on the negative potential node VNEG, a constant current I2 is provided. Current I2 has a known value, dependent on the value of the current generated by the current generator IREF and on the dimensions of transistors M1 and M3, as well as on the dimensions of transistors M6 and M8. Transistor M8 is the circuit component through which the discharge of node VNEG to ground is realized, and the discharge current exactly corresponds to the current I2 at the output of the second current mirror, that is constant and of controlled value.

In the case in which the control signal CNT is at the low logical level (ground), transistor M2 is turned on and the two MOSFETs M1 and M3 are off; transistor M4 is turned on and this turns off transistor MS, being the source electrode thereof connected to ground. The two current mirrors are consequently uncoupled.

The output OUT1 of the inverting level translator HV1 has a voltage value equal to VDD and therefore transistor M7 is turned on; the two transistors M6 and M8 have the gate electrodes at a voltage value equal to VNEB and they are therefore off. The turning off of transistor M8 prevents to the node with negative potential VNEG from discharging.

Figure 6:
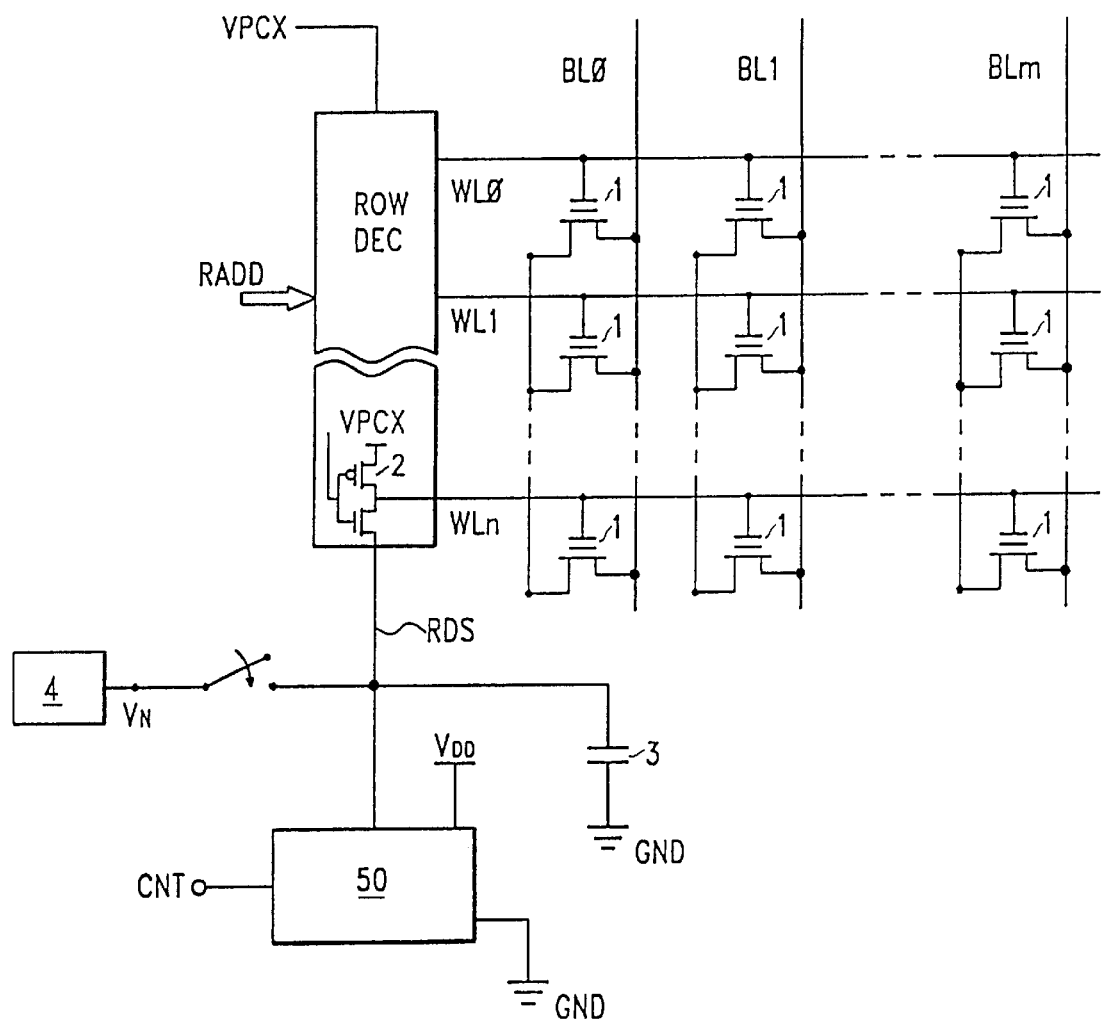
FIG. 6 schematically shows a Flash EEPROM memory including the circuit of the present invention.

The circuit of the present invention is useful in a non-volatile, electrically programmable and erasable memory, for instance the Flash EEPROM memory shown in FIG. 6.

Such figure, substantially analogous to FIG. 1, shows the way a circuit 50 according to the present invention, for instance the circuit of FIG. 4, can be used in place of the conventional switch means 5. As a result of this, it is possible to achieve a controlled-current discharge of capacitance 3, associated with node RDS, from the negative voltage value $V_N$, generated by the charge pump 4 and used during erasing, to ground.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A discharge circuit, powered by a supply voltage, comprising a reference voltage, a node with negative potential, first circuit means adapted to couple said node with negative potential to said reference voltage in response to a control signal, and second circuit means adapted to determine, in said first circuit means, the passage of a controlled current for the discharge of said negative potential node;

wherein said first circuit means comprise:
a current generator controlled by said second circuit means;
first switch means adapted to determine the coupling/uncoupling of said negative potential node to/from said reference voltage in response to said control signal;
wherein said controlled current generator comprises a first MOSFET, with a first terminal operationally connected to said negative potential node, a second terminal operationally connected to said reference voltage and controlled by said second circuit means;
wherein said second circuit means comprise another MOSFET, with the source electrode connected to said negative potential node, the drain and gate electrodes connected together to the control electrode of said first MOSFET forming in such way a first current mirror, and circuit means adapted to provide a suitable reference current to said first current mirror.

2. circuit according to claim 1, wherein said first switch means comprise third circuit means adapted to drive said first MOSFET in response to said control signal so that to determine the turning off thereof when said negative potential node has to be uncoupled from said reference voltage.

3. Circuit according to claim 2, wherein said third circuit means comprise a second MOSFET adapted to drive said first MOSFET, and fourth circuit means adapted to drive said second MOSFET in response to said control signal.

4. Circuit according to claim 3, wherein said fourth circuit means comprise an inverting voltage level translator that receives in input said control signal varying among said reference voltage and said supply voltage, and provides at an output node a signal varying respectively among said supply voltage and said negative voltage.

5. Circuit according to claim 4, wherein said inverting level translator comprises seconds switch means, third switch means, fourth switch means, fifth switch means, said second and fourth switch means on one side and said third and fifth switch means on another side, connected in series among said supply voltage and said negative voltage, and an output correspondent to the node in common among said third switch means and said fifth switch means, said control signal driving said second switch means and said third switch means in such way that when said second switch means are open, also said fifth switch means are open while said third switch means and said fourth switch means are closed, connecting the output to said supply voltage, and vice versa when said second switch means are closed, also said fifth switch means are closed while said third switch means and said fourth switch means are open, connecting the output to said negative voltage.

6. A discharge circuit, powered by a supply voltage, comprising a reference voltage, a node with negative potential, first circuit means adapted to couple said node with negative potential to said reference voltage in response to a control signal, and second circuit means adapted to determine, in said first circuit means, the passage of a controlled current for the discharge of said negative potential node;

wherein said first circuit means comprise:
a current generator controlled by said second circuit means;
first switch means adapted to determine the coupling/uncoupling of said negative potential node to/from said reference voltage in response to said control signal;
wherein said controlled current generator comprises a first MOSFET, with a first terminal operationally connected to said negative potential node, a second terminal operationally connected to said reference voltage and controlled by said second circuit means;
wherein said second circuit means comprise another MOSFET, with the source electrode connected to said negative potential node, the drain and gate electrodes connected together to the control electrode of said first MOSFET forming in such way a first current mirror, and circuit means adapted to provide a suitable reference current to said first current mirror;

wherein said first switch means comprise third circuit means adapted to drive said first MOSFET in response to said control signal so that to determine the turning off thereof when said negative potential node has to be uncoupled from said reference voltage;

wherein said third circuit means comprise a second MOSFET adapted to drive said first MOSFET, and fourth circuit means adapted to drive said second MOSFET in response to said control signal;

wherein said fourth circuit means comprise an inverting voltage level translator that receives in input said control signal varying among said reference voltage and said supply voltage, and provides at an output node a signal varying respectively among said supply voltage and said negative voltage;

wherein said inverting level translator comprises seconds switch means, third switch means, fourth switch means, fifth switch means, said second and fourth switch means on one side and said third and fifth switch means on another side, connected in series among said supply voltage and said negative voltage, and an output correspondent to the node in common among said third switch means and said fifth switch means, said control signal driving said second switch means and said third switch means in such way that when said second switch means are open, also said fifth switch means are open while said third switch means and said fourth switch means are closed, connecting the output to said supply voltage, and vice versa when said second switch means are closed, also said fifth switch means are closed while said third switch means and said fourth switch means are open, connecting the output to said negative voltage; and wherein:
said second switch means comprise a third P-channel MOSFET, with a first electrode connected to said supply voltage, a second electrode connected to a first node and the control electrode driven by a logical complement of said control signal, a fourth P-channel MOSFET, with a first electrode connected to said first node, a second electrode connected to said fourth switch means, and the control electrode connected to said reference voltage, a fifth N-channel MOSFET, with a first electrode connected to said first node, a second electrode connected to said reference voltage and the control electrode driven by said logical complement of said control signal;

said third switch means comprise a sixth P-channel MOSFET, with a first electrode connected to said supply voltage, a second electrode connected to a second node and the control electrode driven by said control signal, a seventh P-channel MOSFET, with a first electrode connected to said second node, a second electrode connected to the output and the control electrode connected to said reference voltage; an eighth N-channel MOSFET, with a first electrode connected to said second node, a second electrode connected to said reference voltage and the control electrode driven by said control signal;

said fourth switch means comprise a ninth N-channel MOSFET, in triple well technology, with a first electrode connected to the control electrode of said fifth switch means, a second electrode connected to said negative voltage and the control electrode connected to the output;

said fifth switch means comprise a tenth N-channel MOSFET, in triple well technology, with a first electrode connected to the output, a second electrode connected to said negative voltage and the control electrode connected to the node in common among said fourth MOSFET and said ninth MOSFET.

7. circuit according to claim 1, wherein said second circuit means are suitable for producing a bias voltage for said first MOSFET adapted to determine the passage of said discharge current.

8. circuit according to claim 6, wherein said fifth circuit means comprise a reference current generator, a second current mirror biased by said reference current generator, sixth circuit means adapted to uncouple said second current mirror from said first current mirror in response to a complement signal of said control signal, and a twelfth MOSFET with an electrode connected to said supply voltage, adapted to drive said second current mirror in response to said control signal.

9. Circuit according to claim 8, wherein said second current mirror comprises a thirteenth MOSFET having the source electrode connected to said supply voltage and the gate and drain electrodes connected together and connected to said reference current generator and to said twelfth MOSFET; a fourteenth MOSFET having an electrode connected to said supply voltage, another electrode connected to said sixth circuit means and having the control electrode connected to said reference current generator.

10. Circuit according to claim 9, wherein said sixth circuit means comprise a fifteenth MOSFET having the source electrode connected to said reference voltage, the drain electrode connected to the drain electrode of said fourteenth MOSFET and driven by said complement signal; a sixteenth MOSFET with the gate electrode connected to said reference voltage, the drain electrode connected to the source electrode of said eleventh MOSFETs and the source electrode connected to the drain electrode of said fifteenth MOSFETs.

11. Circuit according to claim 10, wherein said first, second and eleventh MOSFETs are N-channel and are realized in triple well technology, said twelfth, thirteenth, fourteenth and sixteenth MOSFETs are P-channel, and said fifteenth MOSFET is N-channel.

12. A circuit in combination comprising:
a discharge circuit, powered by a supply voltage, comprising a reference voltage, a node with negative potential, first circuit means adapted to couple said node with negative potential to said reference voltage in response to a control signal, and second circuit means adapted to determine, in said first circuit means, the passage of a controlled current for the discharge of said negative potential node;
wherein said first circuit means comprise:
  a current generator controlled by said second circuit means;
  first switch means adapted to determine the coupling/uncoupling of said negative potential node to/from said reference voltage in response to said control signal;
  wherein said controlled current generator comprises a first MOSFET, with a first terminal operationally connected to said negative potential node, a second terminal operationally connected to said reference voltage and controlled by said second circuit means;

wherein said second circuit means comprise another MOSFET, with the source electrode connected to said negative potential node, the drain and gate electrodes connected together to the control electrode of said first MOSFET forming in such way a first current mirror, and circuit means adapted to provide a suitable reference current to said first current mirror; and a semiconductor electrically programmable and erasable non volatile memory comprising at least an individually erasable memory sector, said memory sector comprising a set of memory cells, arranged in rows and columns, driving means for the rows, said driving means for the rows being fed by a first positive voltage and by a second voltage which takes a value equal to the reference voltage of the memory during the reading and the programming of the memory while in erasing it takes a negative value.

* * * * *